(12) United States Patent
Nomura

(10) Patent No.: US 7,750,710 B2
(45) Date of Patent: Jul. 6, 2010

(54) DELAY CIRCUIT

(75) Inventor: Kenichi Nomura, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 0 days.

(21) Appl. No.: 11/265,104

(22) Filed: Nov. 3, 2005

(65) Prior Publication Data

US 2007/0013427 A1     Jan. 18, 2007

(30) Foreign Application Priority Data

Jul. 12, 2005     (JP) .............................. 2005-203054

(51) Int. Cl.
    *H03H 11/26*     (2006.01)
(52) U.S. Cl. ...................................... 327/276; 327/277
(58) Field of Classification Search ........................ None
See application file for complete search history.

(56) References Cited

U.S. PATENT DOCUMENTS

| | | | |
|---|---|---|---|
| 5,606,276 A * | 2/1997 | McClintock | 327/263 |
| 5,982,213 A * | 11/1999 | Schenck et al. | 327/276 |
| 6,198,322 B1 | 3/2001 | Yoshimura | |
| 6,400,201 B1 * | 6/2002 | Inamori et al. | 327/277 |
| 6,493,305 B1 | 12/2002 | Hayashi et al. | |
| 6,587,811 B2 * | 7/2003 | Schleifer et al. | 702/176 |
| 6,967,516 B2 * | 11/2005 | Okayasu | 327/276 |
| 2002/0039036 A1 * | 4/2002 | Inamori et al. | 327/101 |
| 2003/0052718 A1 | 3/2003 | Takai | |
| 2005/0206425 A1 * | 9/2005 | Shutoku et al. | 327/261 |

FOREIGN PATENT DOCUMENTS

| | | |
|---|---|---|
| JP | 3-094512 A | 4/1991 |
| JP | 2000-163999 | 6/2000 |
| JP | 2001-210020 | 8/2001 |
| JP | 2002-158566 A | 5/2002 |

* cited by examiner

*Primary Examiner*—Lincoln Donovan
*Assistant Examiner*—Khareem E Almo
(74) *Attorney, Agent, or Firm*—Arent Fox LLP

(57) ABSTRACT

A delay circuit has a second delay element 8 supplied with a delay time control signal Vcntl from a frequency variable oscillator 2 including a first delay element 8 of which delay time as a concomitant of signal propagation is controlled by a delay time control signal and a phase inverting element 9 inverting a phase of the signal, and an adjusting element 10, connected in series to the second delay element 8, to which the signal is propagated, wherein a total of the delay time of the second delay element 8 and the delay time of the adjusting element 10 is adjusted.

12 Claims, 10 Drawing Sheets

DELAY CIRCUIT

BACKGROUND OF THE INVENTION

The invention relates a delay circuit that delays an input signal and supplies a delay signal having a predetermined phase difference from the input signal.

An analog PLL (Phase Locked Loop) oscillator is utilized for multiplying a clock frequency, a skew adjustment of a clock within an LSI (Large-scale Integrated Circuit), and so on. The analog PLL oscillator is provided as an indispensable circuit (or as a macro of a CAD tool) for actualizing speed-up and scale-up of the LSI over the recent years.

Further, there is a DLL (Delay Locked Loop) circuit as a technology similar to the analog PLL oscillator. The DLL circuit has been in versatile usage with the spread of the fast LSI such as DDR-SDRAM (Double Data Rate Synchronous Dynamic Random Access Memory). The DLL circuit can generate a delay intended by a circuit designer. Therefore, the DLL circuit is an indispensable circuit (or the macro) for generating a desired delay and for interfacing with the fast LSI.

[Patent document 1] Japanese Patent Application Laid-Open Publication No. 2000-163999

[Patent document 2] Japanese Patent Application Laid-Open Publication No. 2001-210020

SUMMARY OF THE INVENTION

There is, however, further speed-up of the LSI, and besides even in the general-purpose LSI such as the DDR-SDRAM, timing specifications slightly differ depending on LSI makers as the case may be. Therefore, if a user-maker using such a type of general-purpose fast LSI interfaces the fast LSI such as the DDR-SDRAM with a user-maker's own LSI, there often arises a problem about setting the timing.

It is an object of the invention is to provide a technology enabling the setting of accurate timing between the LSIs operating fast.

MEANS FOR SOLVING THE PROBLEMS

The invention adopts the following means in order to solve the problems. Namely, the invention is a delay circuit comprising a second delay element supplied with a delay time control signal from a frequency variable oscillator including a first delay element of which delay time as a concomitant of signal propagation is controlled by a delay time control signal and a phase inverting element inverting a phase of the signal, and an adjusting element, connected in series to the second delay element, to which the signal is propagated, wherein a total of the delay time of the second delay element and the delay time of the adjusting element is adjusted.

Further, the invention is a delay circuit that may comprise a second delay element supplied with a delay time control signal from a frequency variable oscillator including a first delay element of which delay time as a concomitant of signal propagation is controlled by a delay time control signal and a phase inverting element inverting a phase of the signal driven by a shunt signal that shunts the delay time control signal, and an adjusting element adjusting delay time of the second delay element by shunting a signal substantially equal to the shunt signal from the delay time control signal supplied to the second delay element.

According to the invention, it is possible to set the accurate timing between the LSIs operating fast.

DETAILED DESCRIPTION OF THE INVENTION

A timing control circuit according to a best mode (which will hereinafter be referred to as an embodiment) for carrying out the invention, will hereinafter be described with reference to the drawings. Configurations of the following embodiments are exemplifications, and the invention is not limited to the configurations of the embodiments.

First Embodiment

A timing control circuit according to a first embodiment of the invention will be explained with reference to the drawings in FIGS. 1 through 9.

<Basic Configuration>

Figure 1:
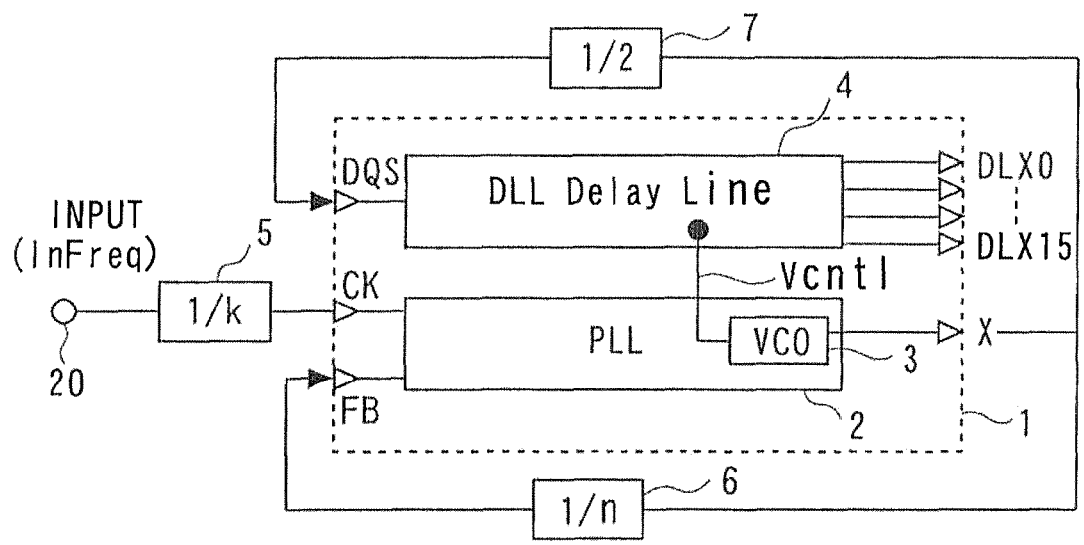
FIG. 1 is a diagram of a basic configuration of a timing control circuit.

FIG. 1 shows a diagram of a basic configuration of the timing control circuit according to the first embodiment. This timing control circuit has a configuration of combining a PLL circuit 2 with a DLL circuit 4. This combined portion of the PLL circuit 2 and the DLL circuit 4 may be provided as a DLL macro block 1 on a CAD tool for an LSI design.

A reference clock signal is inputted to the PLL circuit 2 via an input terminal 20 and a frequency dividing circuit 5. A clock after this frequency division is called a clock CK. On the other hand, the PLL circuit 2 has a voltage control oscillator 3 (corresponding to a frequency variable oscillator according to the invention). As known well, the voltage control oscillator 3 is an oscillator capable of controlling a oscillating frequency and a phase by a control voltage from the outside. In FIG. 1, an output of the voltage control oscillator 3 is shown as a clock X.

As shown in FIG. 1, the output clock X of the voltage control oscillator 3 is frequency-divided by "n" (1/n) in the frequency dividing circuit 6, resulting in becoming a clock FB. The PLL circuit 2 compares the clock CK with the clock FB, and applies a negative feedback to a control voltage Vcntl of the voltage control oscillator 3 so that phases of these clocks are coincident with each other.

For instance, if a phase of the clock FB into which the output clock X of the voltage control oscillator 3 is frequency-divided advances ahead of the clock CK into which the reference clock is frequency-divided, the control voltage Vcntl is decreased so as to delay the phase of the output clock of the voltage control oscillator 3. Further, if the phase of the clock FB into which the output clock X of the voltage control oscillator 3 is frequency-divided delays behind the clock CK into which the reference clock is frequency-divided, the control voltage Vcntl is increased so as to advance the phase of the output clock of the voltage control oscillator 3. This is configured by a circuit that detects a phase difference between the clocks CK and FB and by a charge pump circuit that generates positive/negative voltages corresponding to the phase difference.

Then, when the phase difference between the clocks CK and FB disappears, the control voltage Vcntl for controlling the frequency of the voltage control oscillator 3 converges at a predetermined value, and the oscillating frequency of the PLL circuit 2 is fixed to the nth multiple of the clock CK (where "n" is a frequency dividing count (divisor) of the frequency dividing circuit 6). Further, in output clocks "x" of the PLL circuit 2, a phase of the head clock having a divided-by-n frequency is fixed to the phase of the clock CK. The timing control circuit in FIG. 1 supplies the control voltage Vcntl at this time to a delay element building up a delay line of the DLL circuit 4 (the voltage signal Vcntl supplied at this time corresponds to a delay time control signal according to the invention). The delay element is constructed of the same type of element as an element that determines a frequency of the voltage control oscillator 3. Hence, it follows that the delay time in the DLL circuit 4 is controlled by the control voltage Vcntl which locks the frequency and the phase in the PLL circuit 2.

Figure 2:
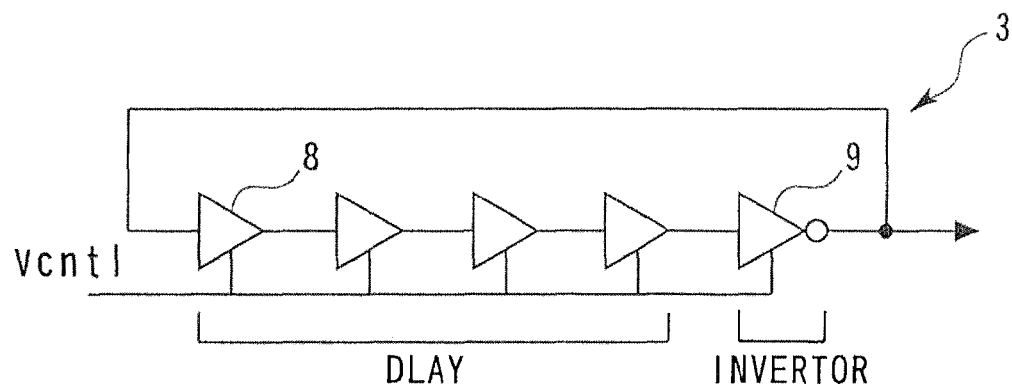
FIG. 2 is a circuit diagram of a voltage control oscillator.

FIG. 2 shows a circuit diagram of the voltage control oscillator 3 in the first embodiment. The voltage control oscillator 3 includes a four-stage oscillation circuit (which will hereinafter be called a delay element(s) 8 and corresponds to a first delay element according to the invention), and a one-stage inverter circuit 9 (corresponding to a phase inverting element according to the invention). The voltage control oscillator 3 feeds an output of the inverter circuit 9 back to an input of the head delay element 8. The frequency is formed by looping twice round the circuit (constructed of the four-stage delay elements 8 and the one-stage inverter circuit 9) in FIG. 2. The signal after the first loop is fed back in an inverted state to the head delay element 8 through the four-stage delay elements 8 and the one-stage inverter circuit 9. Then, that is because the signal after the second loop is fed back in a positive-phase state to the head delay element 8.

Figure 3:
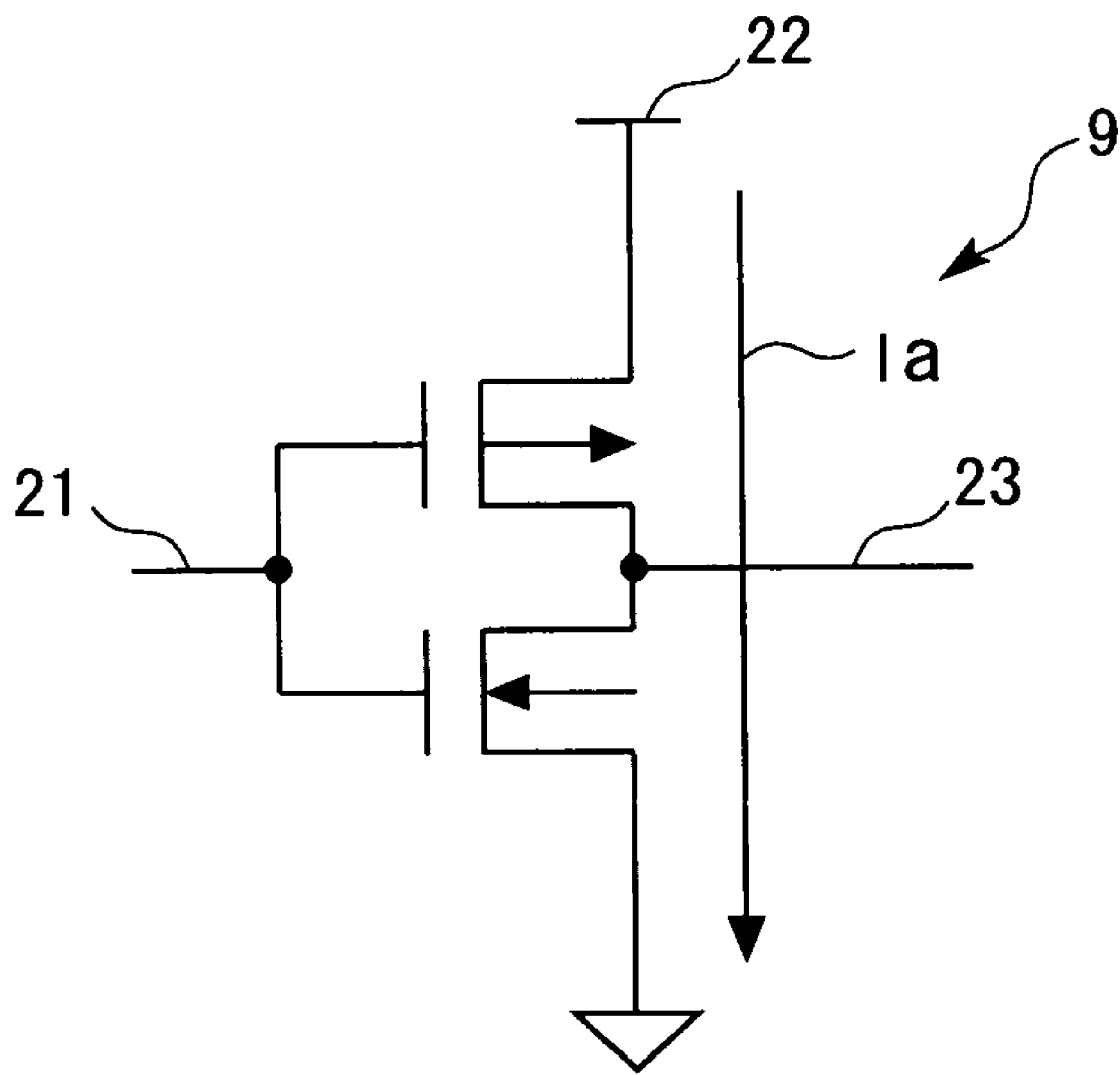
FIG. 3 is a circuit diagram of an inverter circuit.

FIG. 3 shows a circuit diagram of the inverter circuit 9. In the first embodiment, the inverter circuit 9 is constructed of CMOS (Complementary Metal-Oxide Semiconductor) transistors. Namely, in the configuration in FIG. 3, gates f a PMOS (P-channel MOS) transistor and of an NMOS (N-channel MOS) transistor are connected to a common input terminal 21, a source of the PMOS transistor is connected to a power source terminal 22, a source of the NMOS transistor is connected to a ground potential, and drains of the PMOS transistor and of the NMOS transistor are connected to an output terminal 23.

The configuration of the delay element 8 is also the same as in FIG. 3. In the delay element 8, however, a source of the delay element 8 is supplied with the control voltage Vcntl as a substitute for the power source voltage, and a capacitor element serving as a load is connected to between the output terminal 23 and the ground potential. Alternatively, a resistor (having a magnitude) larger than a resistor provided in the inverter circuit 9 may also be inserted between the output terminal 23 and an input terminal at the next stage (or between the output terminal 23 and the capacitor element) in each of the four stage delay elements. As a result, charging and discharging of the capacitor element are conducted at a variation rate determined by a time constant based on the capacitor (capacitance) and the resistor (resistance), and the signal is propagated (transmitted) through one element (ranging from the input terminal 21 to the output terminal 23) of the delay elements 8 in delay time corresponding to the control voltage Vcntl. On the other hand, propagation time of the inverter circuit 9 has an extremely small value as compared with the delay element 8.

Figure 4:
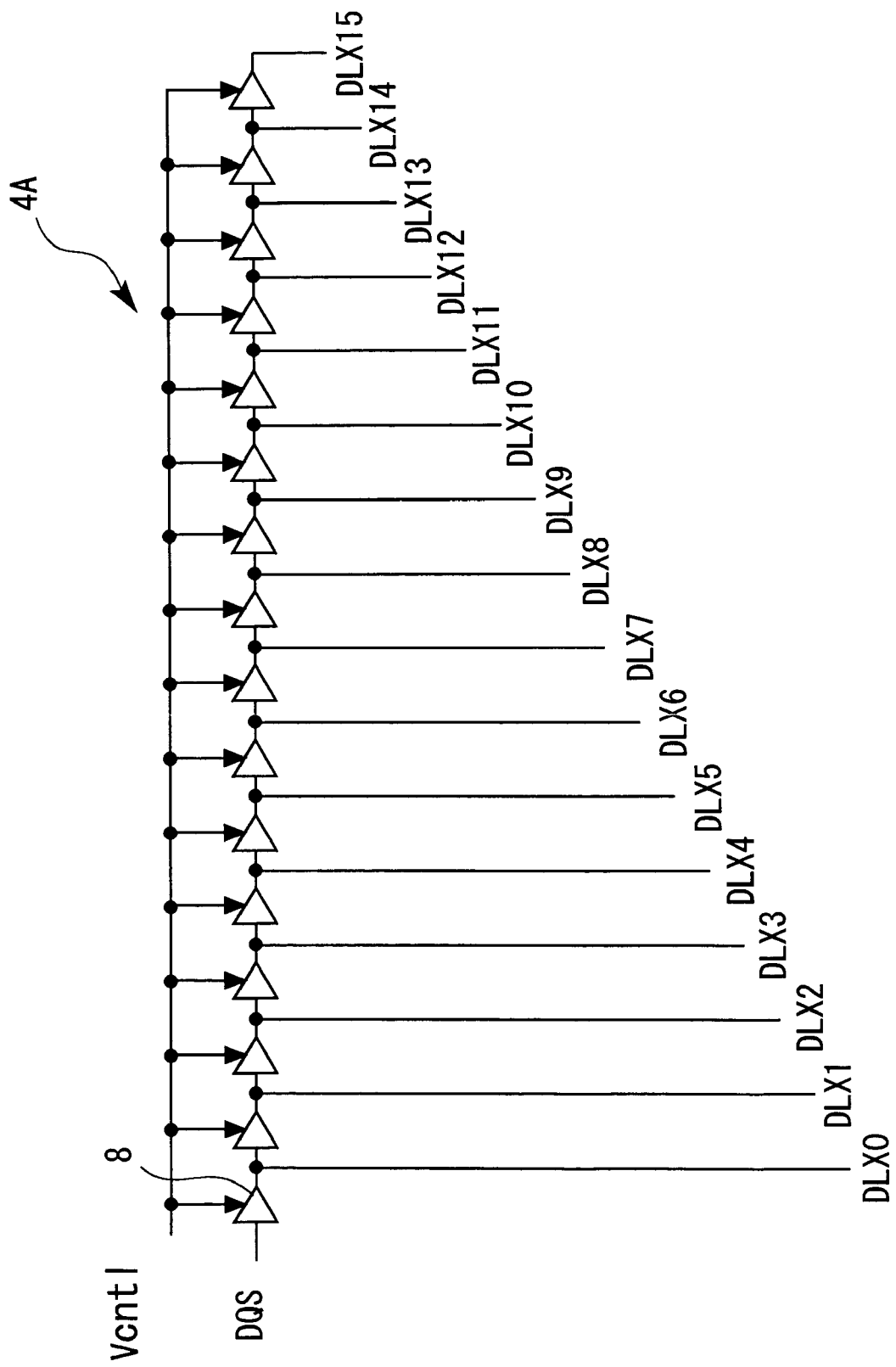
FIG. 4 is a diagram of a configuration of a delay line included in a DLL circuit.

FIG. 4 shows a configuration of a delay line 4A of the DLL circuit 4. The delay line 4A is configured by providing four stages of circuit portions (the circuit indicated by a character string "DELAY" in FIG. 2) each excluding the inverter circuit 9 from the voltage control oscillator 3. Accordingly, it follows that sixteen stages of the delay elements 8 (corresponding to a second delay element according to the invention) are connected. In FIG. 4, the output signals of the respective 16-stage delay elements 8 are designated by symbols DLX0-DLX15. Further, DQS represents a signal to the input terminal. In the following discussion, DLX0-DLX15 are also called taps of the DLL circuit 4.

Thus, the delay elements 8 are employed as they are for the delay line 4A of the DLL circuit, and besides, the delay element 8 of the DLL circuit 4 is supplied with the control voltage Vcntl for controlling the frequency of the PLL circuit 2 and therefore has substantially the same signal propagation time, i.e., the same delay time as the delay element 8 of the PLL circuit 2 has.

Therefore, when signals obtained in a way that divides the oscillating frequency of the PLL circuit 2 by 2 are introduced into the DLL circuit 4, it follows that the signals for approximately one wavelength occupy over the delay line 4A configured by the 16-stage delay elements 8 in FIG. 4. Namely, in terms of time, after one cycle since the input signal was inputted to DLX0, this signal is outputted from DLX15. Hence, the signal generated by the PLL circuit 2 is frequency-divided by 2 and set as an input signal (reference signal DQS) to the DLL circuit 4 in FIG. 4, whereby delay waveforms obtained by dividing one cycle of the reference signal DQS by 16 taps (16-tap-division) can be respectively generated.

Note that in FIG. 1, the input signal DQS to the DLL circuit 4 is generated in the way that the signal generated by the PLL circuit 2 is frequency-divided by 2 in a frequency dividing circuit 7, however, as a substitute for this configuration, the input signal DQS may also be supplied from a circuit different from the PLL circuit 2.

Figure 5:
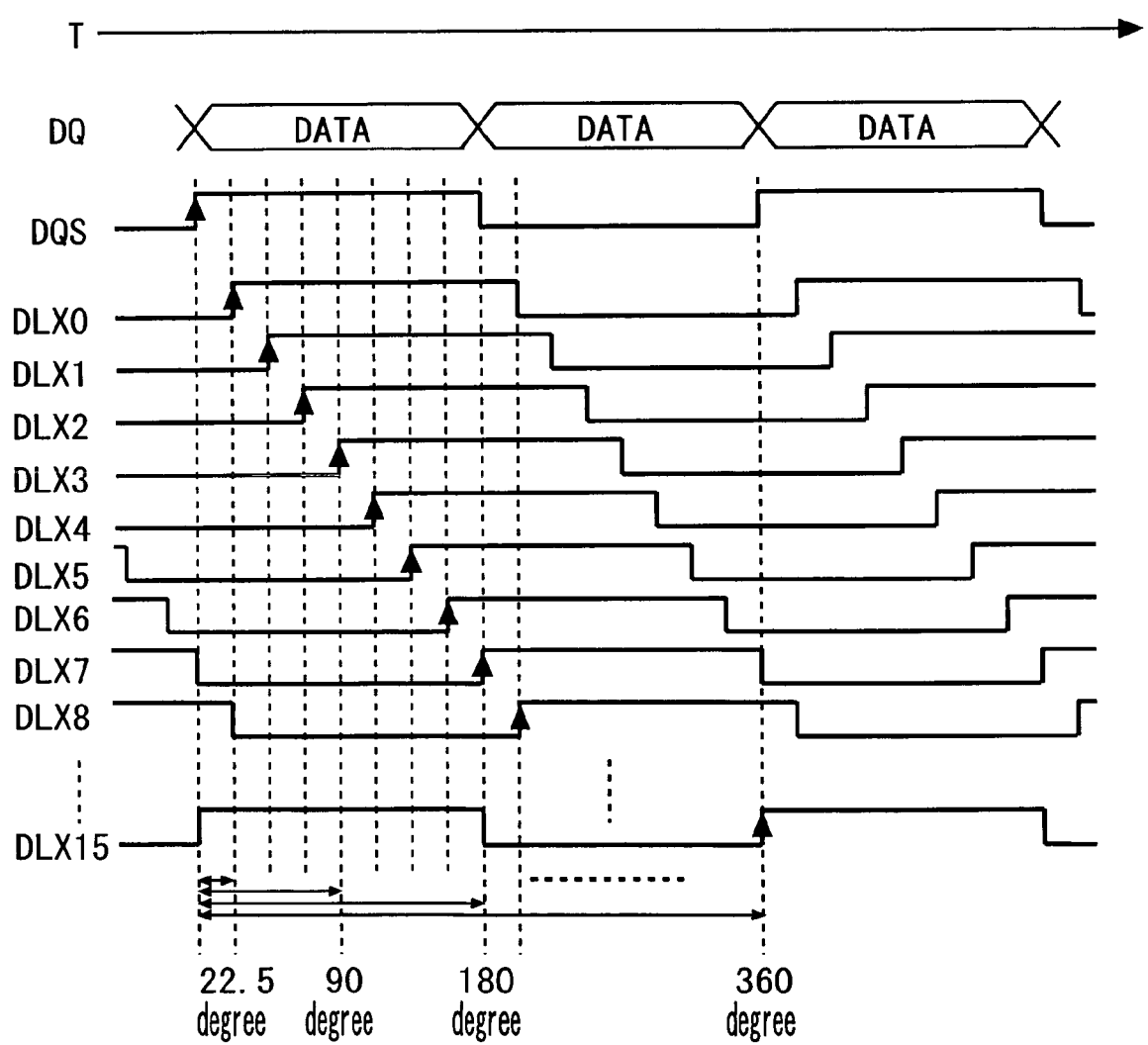
FIG. 5 is a diagram showing phases of delay waveforms when one cycle of an input signal is divided by 16 taps.

FIG. 5 shows phases of the delay waveforms when one cycle of the input signal is divided by 16 taps in the DLL circuit 4. In FIG. 5, the waveforms at the respective stages, which are indicated by DQS and DLX0-DLX15, represent a waveform of the reference signal DQS of the input terminal and waveforms of the output signals DLX0-DLX15 of the respective output terminals of the delay elements in the circuit in FIG. 4.

As in FIG. 5, signals respectively delayed by 22.5 degrees in their phases from DQS are outputted to the respective signals of DLX0-DLX15. For example, the signal with a 90-degree phase delay from DQS is outputted to DLX3, the signal with a 180-degree phase delay from DQS is outputted to DLX7, and then the signal with a 360-degree phase delay from DQS is outputted to DLX15.

The delay line 4A shown in FIG. 4 has, however, the configuration excluding the inverter circuit 9 as compared with the voltage control oscillator 3 shown in FIG. 2. Accordingly, if the control voltage Vcntl for controlling the voltage control oscillator 3 is set intact as the control voltage of each of the delay elements 8 of the DLL circuit 4, it follows that the drive current becomes too much. To be specific, as shown in FIG. 3, Ia is assumed to be a through-current at a switching time when the inverter circuit 9 of the CMOS operates. The DLL circuit 4 in FIG. 4 comes to have the drive current that is larger by 4×Ia than in the case of connecting four stages of the voltage control oscillators 3 in FIG. 3.

As a result, the propagation time of the DLL circuit 4 is shortened, and it follows that the signal is outputted at an earlier stage than the intended delay. This is because impedance as viewed from the input side of the control voltage Vcntl is higher in the case of the DLL circuit 4 than in the case of originally connecting the four stages of the voltage control oscillators 9, and the control voltage Vcntl in the case of DLL circuit 4 is set higher than in the case of the PLL circuit 2.

<Configuration of DDL Circuit>

Figure 6:
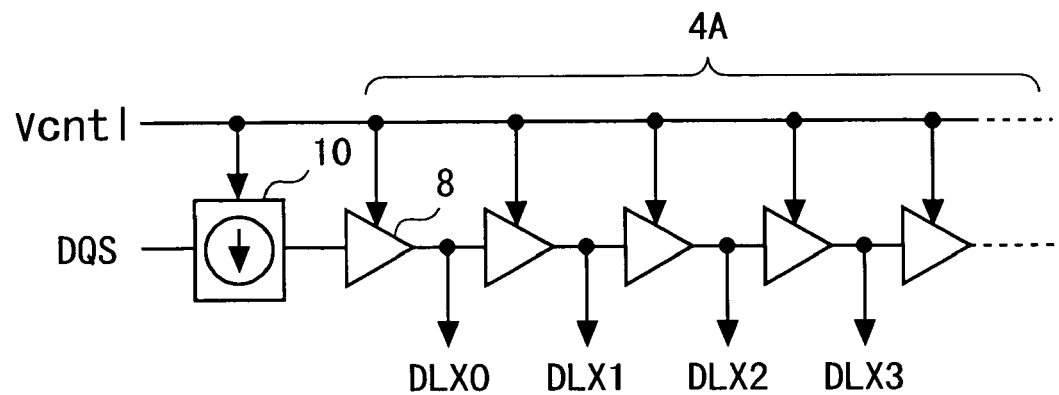
FIG. 6 is a diagram of a configuration of the DLL circuit in a first embodiment.

FIG. 6 shows a configuration of the DLL circuit 4 in the first embodiment. This DLL circuit 4 has the delay line 4A in FIG. 4 and a constant current circuit 10 (corresponding to an adjusting element according to the invention) anterior to this line 4A. As explained in <Basic Configuration> given above, in the case that the sixteen stages of only the delay elements 8 of the PLL circuit 2 are connected in the DLL circuit 4, an error occurs due to the through-current Ia flowing to the inverter circuit 9 of the PLL circuit 2. Such being the case, a DLL circuit 4 in the first embodiment, the constant current circuit 10 being connected to the front stage of the DLL circuit 4, reduces the error by a signal propagation delay by the constant current circuit 10.

Figure 7:
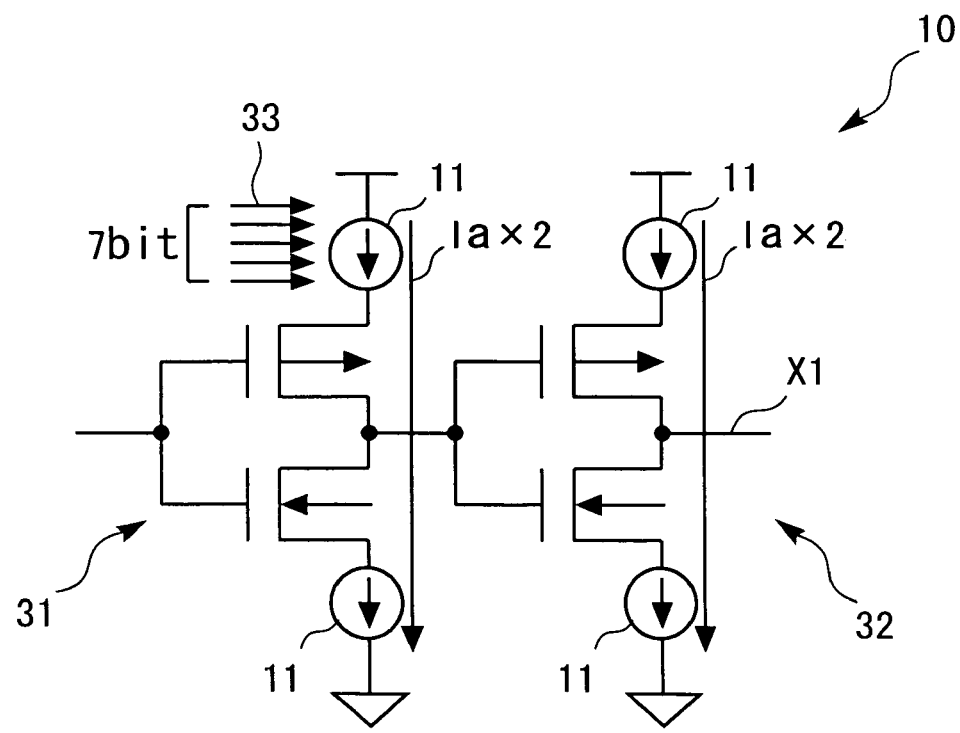
FIG. 7 is a conceptual diagram of a constant current circuit in the first embodiment.

FIG. 7 shows a conceptual diagram of the constant current circuit 10. This constant current circuit 10 is constructed of a constant current source 11 (corresponding to a current source according to the invention) of which a current value is controlled by a digital signal 33, and of two stages of CMOS circuits 31, 32 driven by the constant current sources 11. Each of the CMOS circuits 31, 32 is provided with the constant current sources 11 on the power source voltage side and on the ground potential side, respectively.

Accordingly, the current value of each of the constant current sources 11 is set by the digital signal 33 as the through-current Ia of the inverter circuit 9, whereby totally (4×Ia) drive current flows to the two stages of the CMOS circuits 31, 32 (the digital signal 33 corresponds to an adjusting signal according to the invention. Further, the input terminal for the digital signal 33 corresponds to a digital signal input unit according to the invention). Herein, assuming that the signal propagation time by the CMOS circuits 31, 32 is substantially proportional to the drive current, it is possible to reduce the error in the propagation time due to the non-existence of the inverter circuit 9 on the delay line 4A by flowing totally (4×Ia) drive current to the two stages of the CMOS circuits 31, 32. Namely, the signals are propagated through the CMOS circuits 31, 32 and are thereby delayed. Totally (4×Ia) drive current flows to these CMOS circuits 31, 32. Therefore, this delay time, in principle, has an effect in canceling such an effect that there are a greater amount of drive current and a shorter period of propagation time when supplying the same control voltage Vcntl in the case of the delay line 4A in FIG. 4 than in the case of PLL circuit 2.

Moreover, in the constant current circuit 10 in FIG. 7, the delay time can be finely adjusted by changing the digital signal 33 for controlling the current value of each constant current source 11, and the phase of the signal outputted from each of the output terminals of DLX0-DLX15 can be finely adjusted.

Figure 8:
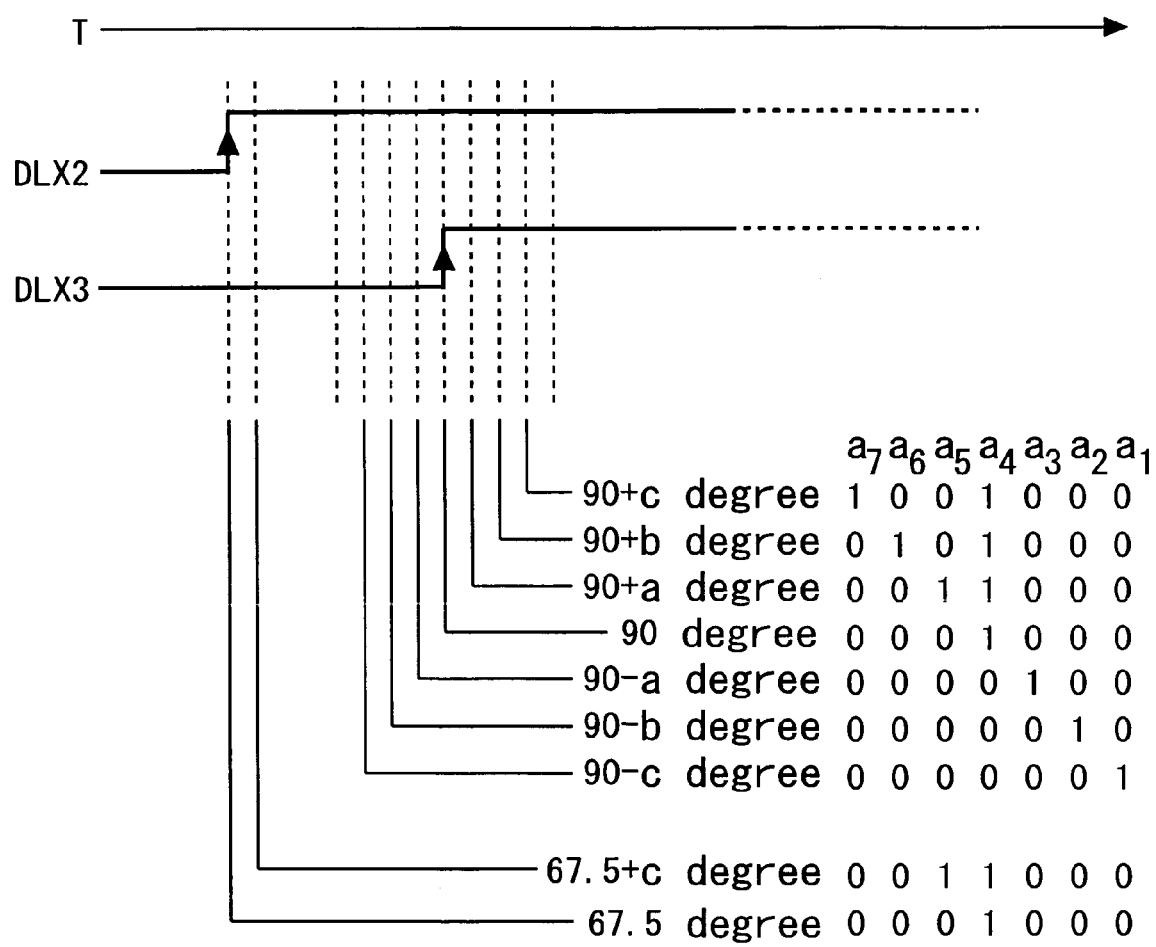
FIG. 8 is a diagram showing a phase fine adjustment function by the constant current circuit in FIG. 7.

FIG. 8 shows a phase fine adjustment function by the constant current circuit 10 in FIG. 7. An assumption in the first embodiment is that a bit count of the digital signal for controlling the constant current source 11 is 7 bits. Further, with respect to each of the respective bits, a circuit for changing the predetermined current value is adopted. With this contrivance, in the constant current circuit 10 shown in FIG. 7, the digital signal 33 is changed, and a change quantity of this digital signal 33 is thus given, whereby the change in the current value of the constant current source 11 can occur. When the current value of the constant current source 11 changes, there varies the charging/discharging time with respect to a gate capacitor and a capacitor of a load circuit when switching ON/OFF the CMOS circuits 31, 32. Accordingly, with the change in the digital signal 33, there varies the propagation time when a pulse signal containing a high frequency passes through the COMS gates 31, 32.

In FIG. 8, when the digital signal is "0001000", for example, the through-current Ia shown in FIG. 3 flows to each of the constant current sources 11 in FIG. 7. As a result, idealistically, a phase difference of the signal DLX3 from DQS comes to 90 degrees. Herein, the respective bits "0001000" of the digital signal are expressed by symbols such as a1, a2, a3, a4, a4, a5, a6, a7. In "0001000", this is a case where the central bit a4 is "1", and other bits are all The first embodiment, when the respective bits a5, a6, a7 become "1", there are employed the constant current sources for flowing the respective currents given such as I5=Ia+Δa, I6=Ia+Δb, I7=Ia+Δc. Further, when the respective bits a3, a1, a1 become "1", there are employed the constant current sources for flowing the respective currents given such as I3=Ia−Δa, I2=Ia−Δb, I1=Ia−Δc.

With this configuration, the drive current of the constant current circuit 10 can be controlled by switching ON or OFF the respective bits of the digital signal 33, thus making it possible to control the signal propagation time. For instance, the current of 4×(Ia+ha) is flowed by use of the digital signal "0001100", whereby the phase of DLX3 can be set to 90 degrees+a (the phase difference due to the current Δa) from DQS. Further, the current of 4×(Ia+Δb) is flowed by use of the digital signal "0001010", whereby the phase of DLX3 can be set to 90 degrees+b (the phase difference due to the current Δb) from DQS.

Namely, these four constant current sources 11 are added to the DLL circuit 4, and the current for 4×Ia is flowed, thereby making it possible to early correct the delay due to influence of the through-current Ia to the inverter circuit 9 of the PLL circuit 2 as described above. In this case, for instance, "0001000" may be set as the digital signal 33. Even when the current of Ia×4 is flowed from the constant current source 10 as a whole in FIG. 7 by setting "0001000" as the digital signal 33 and flowing Ia to each of the current sources 11, however, there is no complete coincidence of the delay characteristics between the PLL circuit 2 and the DLL circuit 4, and, for example, there might be a case in which the signal with the delay of precisely 90 degrees is not outputted from DLX3. For instance, this is the case of not falling within a range in which the characteristics of all the delay elements 8 are not deemed sufficiently to be the same. Moreover, this is the case where the delay time of the inverter circuit 9 can not be ignored. In such a case, the fine adjustment may be made by changing the values of the respective bits "a1, a2, a3, a4, a4, a5, a6, a7" of the digital signal 33 from "0001000".

Further, as shown in FIG. 5, there might be a case of requiring phase differences other than the phase differences (22.5 degrees, 45 degrees, 67.5 degrees, 90 degrees, etc.) given by every 22.5 degrees into which one cycle is divided by 16 taps. In this case, the signals with desired phase differences may be generated as DLX0-DLX15 by setting the values of the respective bits "a1, a2, a3, a4, a4, a5, a6, a7" of the digital signal 33.

Figure 9:
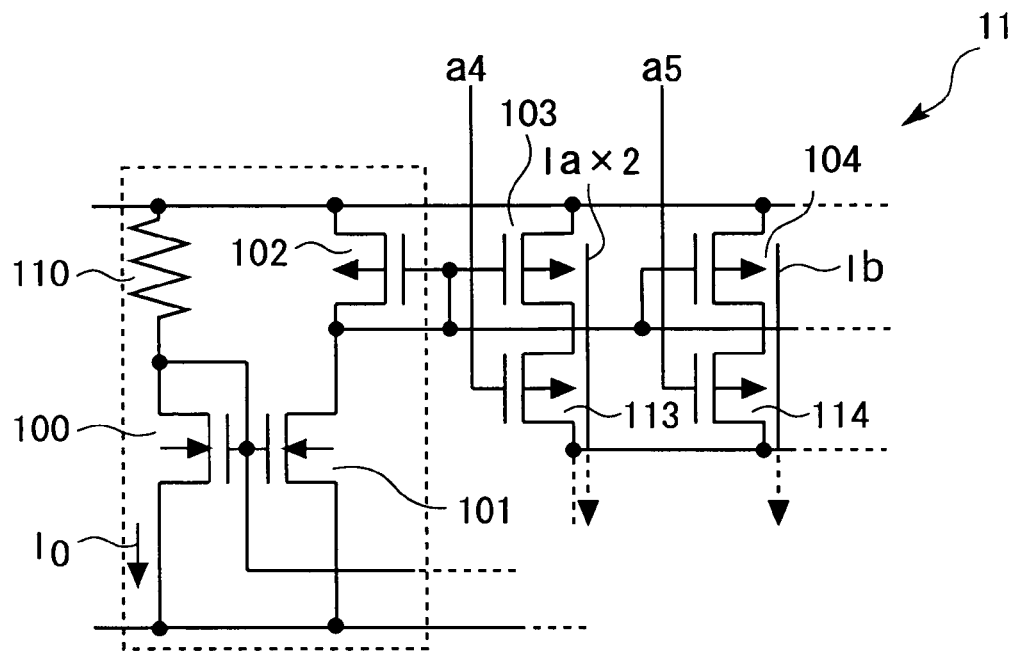
FIG. 9 is a diagram showing a specific configurational example of the constant current circuit in FIG. 7.

FIG. 9 shows an example of a specific configuration of the constant current source 11 in FIG. 7. FIG. 9 explicitly shows a control circuit using the bits a4, a5 in the digital signal 33. In the constant current source 11 in FIG. 9, an NMOS transistor 100 and an NMOS transistor 101 build up a current mirror circuit. Further, a current mirror circuit is constructed of a PMOS transistor 102 provided between a drain of the NMOS transistor 101 and a power source and of PMOS transistors 103, 104, etc. Moreover, PMOS transistors 113, 114, etc. are provided as switches between the ground and drains (now, these ground-sided terminals are set as drains) of the PMOS transistors 102, 103, etc.

Both of the drain and the gate of The NMOS transistor 100 are connected to the power source via a resistor 110. Accordingly, the NMOS transistor 100 is switched ON by a diode connection, and a current specified by the resistor 110 flows through between the source and the drain.

The NMOS transistor 101, together with the NMOS transistor 100, configures the current mirror circuit, and the drain and the gate of the PMOS transistor 102 are connected to the drain of the NMOS transistor 101. Thus, the transistor 102 becomes a load of the transistor 101 by the diode connection, however, as known well, in a saturation region, a current (which will hereinafter simply be called a drain current) flowing through between the source and the drain of the NMOS transistor 101 basically depends on a source/gate voltage and depends on a source/drain voltage to a small degree. Therefore, the drain current of the NMOS transistor 101 is substantially determined by a gate voltage supplied from the drain of the NMOS transistor 100. This current is determined by a physical dimension ratio of the NMOS transistors 100 and 101 for the drain current of the NMOS transistor 100.

Further, the drain current of the NMOS transistor 101 becomes a drain current of the PMOS transistor 102 defined as the load thereof. The PMOS transistor 102 supplies the gate voltage to the PMOS transistors 103, 104, and similarly controls the drain current thereof.

Considered now is a case in which the PMOS transistors 113, 114 as the switches are switched ON. In this case, the drain currents of the PMOS transistors 103, 104 are still determined by a physical dimension ratio of the PMOS transistor 102 and the PMOS transistors 103, 104, etc. Accordingly, a drain current I3 of the PMOS transistor 103 can be set such as I3=a×b3×I, where I is a drain current of the NMOS transistor 100, a is a dimension ratio of the NMOS transistors 100, 101, and b3 is a dimension ratio of the PMOS transistors 102, 103. Similarly, a drain current I4 of the PMOS transistor 104 can be set such as I4=a×b4×I, where b4 is a dimension ratio of the PMOS transistors 102, 104.

Then, the currents I3, I4 can be ON/OFF-controlled by performing the ON/OFF control of the PMOS transistors 113, 114 as the switches. Hence, the drain current I3 of the PMOS transistor 103 can be rendered approximately coincident with the through-current Ia of the inverter circuit 9 shown in FIG. 3 by properly setting the resistor 110 and the physical dimensions of the respective transistors.

When the constant current source 11 is thus, built up and employed for the constant current circuit 10 illustrated in FIG. 7, the bit corresponding to the gate voltage of the PMOS transistor 113 is set to 1 while other bits are set to 0, whereby the current Ia is supplied from each constant current source 11 while the control current of Ia×2 (totally Ia×4) is supplied to each of the CMOS circuits 31, 32. This current value is equal to the drive current in the case of providing four pieces of inverter circuits 9 of the PLL circuit shown in FIG. 2. Accordingly, the CMOS circuits 31, 32 function as adjusting elements for reducing such an effect as to generate an extra driving current for 4×Ia on the delay line 4A in FIG. 4 and decrease the delay time when supplied with the same control voltage Vcntl as compared with the case of the PLL circuit 2.

FIG. 9 shows the PMOS transistors 113, 114 defined as the switches corresponding to a4, a5 among the respective bits a1, a2, a3, a4, a4, a5, a6, a7 shown in FIG. 8. As for other bits a1, a2, a3, a6, a7, however, these elements can be configured in the same way as the PMOS transistors 103, 104 and the PMOS transistors 113, 114.

Namely, when each of the bits a5, a6, a7 becomes 1, it is possible to construct the constant current sources that flow the respective currents such as I5=Ia+Δa, I6=Ia+Δb, I7=Ia+Δc. Further, when each of the bits a3, a2, a1 becomes 1, it is possible to construct the constant current sources that flow the respective currents such as I3=Ia−Δa, I2=Ia−Δb, I1=Ia−Δc. Accordingly, these bits are controlled, whereby the respective phases of DLX0-DLX15 can be, as shown in FIG. 8, precisely adjusted to the values ranging from 22.5 degrees to 360 degrees in units of 22.5 degrees. Furthermore, the bits a1, a2, a3, a4, a4, a5, a6, a7 are switched over, whereby the fine adjustments can be made about the centers of the phases thereof. Moreover, the delay of 22.5 degrees may be equally divided through the bits a1, a2, a3, a4, a4, a5, a6, a7 by selecting the current of the constant current source 11.

As discussed above, according to the timing control circuit in the first embodiment, the respective phases of the taps DLX0-DLX15 in the DLL circuit 4 can be set in units of 22.5 degrees more accurately than in the case of having no such configuration. Further, the respective phases of the taps DLX0-DLX15 in the DLL circuit 4 can be finely adjusted in the phases in units of 22.5 degrees or thereabouts. Besides, the phases in units of 22.5 degrees can be further equally divided.

Note that the first embodiment has exemplified 7 bits as the bit count for controlling the constant current source 11, however, the embodiment of the invention is not limited to this bit count, and the constant current source 11 may be controlled by a bit count equal to or smaller than 6 bits and may also be controlled by a bit count equal to or greater than 8 bits.

Further, in the example in FIG. 8, when the bits are "0001000", the respective phases of the taps DLX0-DLX15 in the DLL circuit 4 are set in units of 22.5 degrees. Then, the configuration is that the phases can be adjusted about the centers of the phases in units of 22.5 degrees by switching over the bits a1, a2, a3, a4, a4, a5, a6, a7. In place of this, however, for example, in the case of the bits "0000001", the respective phases of DLX0-DLX15 may be set in units of 22.5 degrees. In this case, the individual phases of DLX0-DLX15 may be delayed from the values in units of 22.5 degrees by increasing the ON-bits in the bits a1, a2, a3, a4, a4, a5, a6, a7 from 00000001 toward 1111111. Further, the respective phases of DLX0-DLX15 may advance from the values in units of 22.5 degrees by increasing the ON-bits in the bits a1, a2, a3, a4, a4, a5, a6, a7 from 00000001 toward 1111111.

Moreover, the current mirror circuit in FIG. 9 has been exemplified by way of the example of the constant current source 11, however, the embodiment of the invention is not limited to the current mirror circuit in FIG. 9. Further, there is a limit neither to the constant current source 11 nor to the current mirror circuit, and a variety of known constant current circuits are usable.

Further, in the first embodiment, the DLL circuit 4 is constructed of the 16-tap DLX0-DLX15, and the phases thereof are set in units of 22.5 degrees. The embodiment of the invention is not, however, limited to the tap divisions. Moreover, as to the voltage control oscillator 3, the delay elements 8 are not restricted to the 4-stage configuration.

For instance, sixteen or less tap divisions are available, and more than 16 tap divisions are also available. In this case, let N be the number of the delay elements 8 of the PLL circuit 2 and M be the number of the delay elements 8 of the DLL circuit 4, and a current given by Ia×M/N for the inverter circuit 9 may flow from the constant current circuit 10 as a whole. Namely, the current value determined from the drive current Ia for driving the inverter circuit 9 (an inverting element), corresponding to a ratio of the number of the delay elements (second delay elements included in the delay circuit) of the DLL circuit 4 to the number of the delay elements 8 (first delay elements) of the PLL circuit 2, may be set in the constant current circuit 10.

Second Embodiment

In the first embodiment, the constant current circuit 10 that flows the current corresponding to the through-current Ia of the inverter circuit 9 of the PLL circuit 2, is provided anterior to the DLL circuit 4. Then, the propagation time of the signal passing through the CMOS circuits 31, 32 included in the constant current circuit 10 is adjusted by controlling the current of the constant current circuit 10.

In a second embodiment, the delay elements 8 are controlled by a control current Ccntl. Namely, the delay time of each delay element 8 is adjusted by changing a value of the control current Ccntl. Therefore, the second embodiment utilizes the constant current circuit 10 as a circuit that shunts the current for controlling the delay element 8. Accordingly, in the second embodiment, the reference signal DQS is inputted directly to the first delay element 8 without passing through the constant current circuit 10. Other configurations and operations in the second embodiment are the same as those in the case of the first embodiment. Such being the case, the same components as those in the case of the first embodiment are marked with the same symbols and numerals, and their explanation are omitted. Further, the drawings in FIGS. 1 through 9 are referred to when the necessity may arise.

Figure 10:
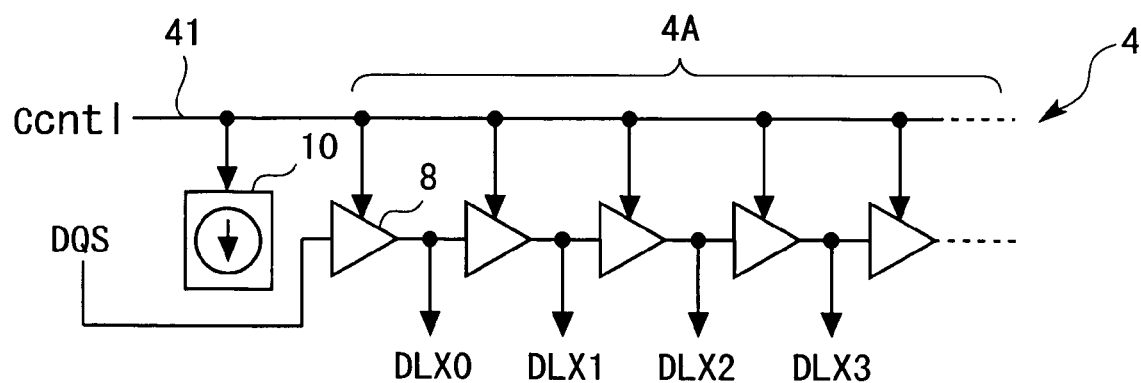
FIG. 10 is a diagram showing a configuration of the DLL circuit according to a second embodiment.

FIG. 10 shows a configuration of the DLL circuit according to the second embodiment. This circuit includes a DLL delay line 4A having the same construction as FIG. 4 shows, a control circuit for supplying the control current Ccntl of the respective delay elements 8 on the DLL delay line 4A, and a constant current circuit 10 (corresponding to an adjusting element according to the invention) that shunts the control current Ccntl. Herein, the configuration of the constant current source 10 is the same as what is shown in FIG. 7 or FIG. 9.

Further, the configuration of the delay element 8 is the same as the delay element 8 in the first embodiment except a point of being controlled by the control current Ccntl. The control current Ccntl can be generated by, e.g., the current mirror circuit. Namely, the configuration may be such that the gates of the two transistors are common, and a current (Ccntl) substantially equal to the current (Ccntl) flowing through between the source and the drain of the first transistor, is flowed through between the source and the drain of the second transistor. Then, a control line 41 shown in FIG. 10 may be connected as a drain load of the second transistor.

Also in the circuit in FIG. 10, the same circuit, which is shown in FIG. 7 or FIG. 9, as the circuit in the case of the first embodiment can be used as the constant current circuit 10. In the second embodiment, the current, flowing to this constant current circuit 10, in the control current Ccntl, is adjusted, thereby precisely adjusting in units of 22.5 degrees the respective phases of the taps DLX0 DLX15 in the DLL circuit 4.

To be specific, a current of Ia×4, which is 4 times as large as the current Ia (see FIG. 3) shunted to the inverter circuit 9 of the voltage control oscillator 3 shown in FIG. 2, is set as a current value of the constant current circuit 10 in FIG. 10, whereby the signal propagation time of each of the delay elements 8 building up the DLL circuit 4 can be rendered substantially coincident with the signal propagation time of the delay element 8 of the voltage control oscillator 3 of the PLL circuit 2. Then, if the delay time of the inverter circuit 9 is well shorter than the delay time of the delay element 8, the individual phases of the taps DLX0-DLX15 in the DLL circuit 4 can be accurately adjusted in units of 22.5 degrees. Moreover, similarly to the first embodiment, the respective phases of the DLX0-DLX15 can be finely adjusted by adjusting the digital signal 33 (7 bits) of the constant current source 11. Further, as in the first embodiment, the control may be done in a way that further equally divides the phases in units of 22.5 degrees by the bits of the constant current source 11.

Moreover, in the second embodiment also, the DLL circuit 4 is constructed of the 16-tap DLX0-DLX15, and the phases thereof are set in units of 22.5 degrees. The embodiment of the invention is not, however, limited to the 16-tap divisions. In this case also, let N be the number of the delay elements 8 of the PLL circuit 2 and M be the number of the delay elements 8 of the DLL circuit 4, and the current given by Ia×M/N for the inverter circuit 9 may flow from the constant current circuit 10 as a whole.

Modified Example

The first embodiment and the second embodiment have involved using the constant current circuit 10 including the constant current sources 11 for accurately adjusting the phases of the taps DLX0 through DLX15 of the DLL circuit 4. The embodiment of the invention is not, however, restricted to this configuration.

Figure 11:
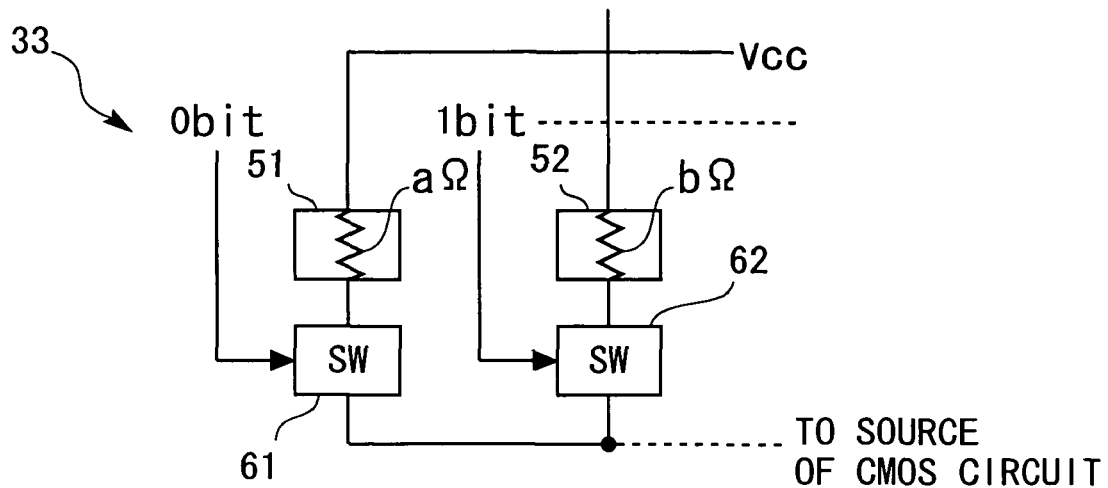
FIG. 11 is a diagram showing an example of supplying a control current by resistors and switches that replace the constant current sources.

FIG. 11 shows an example of supplying the control current through resistors 51, 52, etc. (corresponding to a resistor element according to the invention) and switches 61, 62, etc. that replace the constant current sources 11. As shown in FIG. 11, one terminals of the resistors 51, 52 are respectively connected to a power source voltage Vcc, and the other terminals thereof are respectively connected to sources (power-source-sided terminals) of the CMOS circuits 31, 32 (see FIG. 7) via the switches 61, 62. Therefore, the operation states of the CMOS circuits 31, 32, etc. can be controlled by the bit signals that switch ON/OFF the switches 61, 62. Namely, the operation time can be adjusted by controlling the drive current when the CMOS circuits 31, 32, etc. switch ON/OFF.

With this configuration, the same constant current circuit 10 as in the first embodiment can be constructed, and the signal propagation time of the constant current circuit 10 can be adjusted. For instance, a resistance value may be selected so that the currents flowing across the resistors 51 and 52 are each Ia×2 (totally Ia×4 for the CMOS circuits 31, 32). Hence, similarly to the first embodiment, the phases of the taps DLX0 through DLX15 of the DLL circuit 4 can be adjusted more accurately by ON/OFF of the digital signal 33 than in the case of having no such configuration.

Further, the circuit in FIG. 11 may be employed as the circuit that shunts the current Ia×4 as described in the second embodiment. In this case, the resistors 51, 52 may be connected to a supply current of the control current Ccntl instead of connecting to the power source Vcc.

In this case also, similarly to the second embodiment, the control current Ccntl of the delay elements 8 of the DLL circuit 4 can be rendered substantially coincident with the control current of the delay elements 8 of the PLL circuit 2. As a result, it is possible to make the adjustment so that the delay time of the delay element 8 of the DLL circuit 4 can be made coincident more precisely with the delay time of the delay element 8 of the PLL circuit 2.

Note that FIG. 11 shows the example of controlling the current value through the resistors 51, 52 and the switches 61, 62 (which are shown for only 2 bits). The number of the resistors and the number of the switches are not, however, limited to the numbers explicitly shown in FIG. 11, similarly to the constant current sources in the first embodiment or the second embodiment, the 7-bit configuration may be taken, and the control may be done by use of a much greater bit count.

Figure 12:
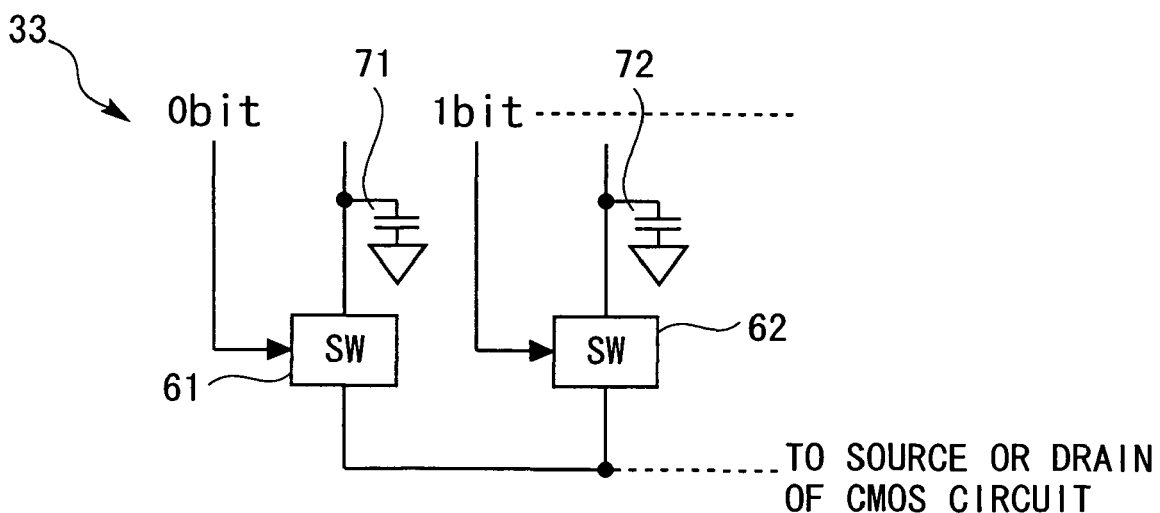
FIG. 12 is a diagram showing an example of a circuit for adjusting the phase by capacitor elements in place of the resistors.

FIG. 12 shows an example of a circuit for adjusting the phases by capacitor elements 71, 72 (corresponding to a capacitor element according to the invention) that replace the resistors 51, 52, etc. As in FIG. 12, one terminals of the capacitor elements 71, 72 are respectively connected to the ground potential, and the other terminals thereof are respectively connected to the sources or the drains of the CMOS circuits 31, 32 (see FIG. 7) via the switches 61, 62.

With this configuration, it is feasible not to adjust the drive currents of the CMOS circuits 31, 32 but to adjust a time constant of the pulse when the CMOS circuits 31, 32 switch ON/OFF. Namely, a load capacitor on the source sides or the drain sides of the CMOS circuits 31, 32 can be adjusted by controlling the bits for switching, ON/OFF the switches. As a result, rise time and fall time of the pulses propagated across the CMOS circuits 31, 32 can be adjusted, and the signal propagation time can be adjusted. Accordingly, as in the first embodiment, the phases of the tap signals DLX0-DLX15 of the DLL circuit 4 can be adjusted more precisely by switching ON/OFF the digital signal 33.

Figure 13:
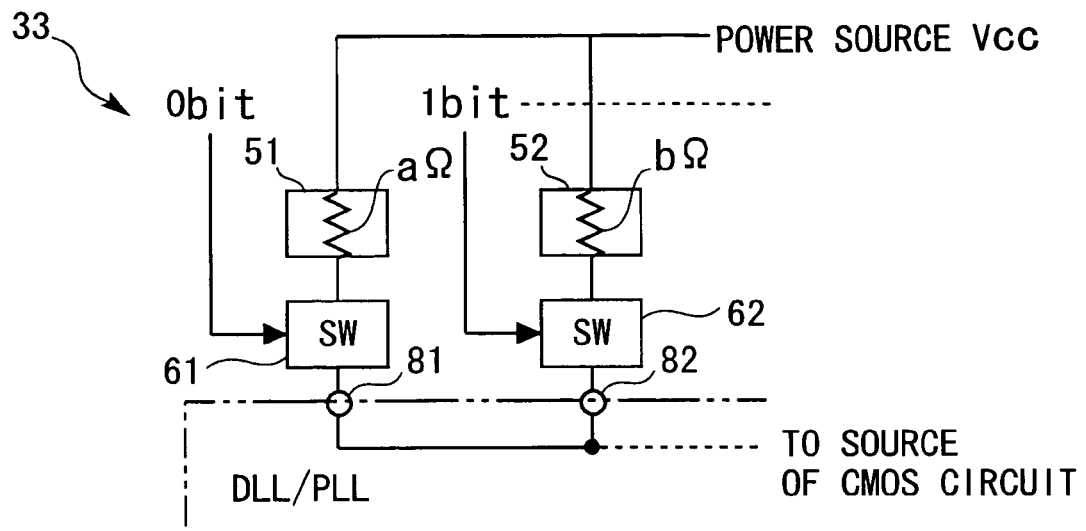
FIG. 13 is a diagram showing a circuit configuration in which the resistors and the switches are externally attached to external terminals of the timing control circuit.

FIG. 13 shows a circuit configuration, wherein the resistors 51, 52 and the switches 61, 62 in FIG. 11 are externally attached to external terminals 81, 82 (corresponding to a terminal train according to the invention) of a timing control circuit (the DLL circuit 4 and the PLL circuit 2). This circuit configuration is the same as the configuration in FIG. 11, except that the resistors 51, 51 and the switches 61, 62 are externally attached.

This configuration being taken, the user can be provided with a function of generating a desired phase difference by use of a desired resistor. It is noted that a configuration as a substitute for the configuration in FIG. 13 may be such that the resistors 51, 52 are externally attached to the external terminals 81, 82, while the switches 61, 62 are built in the timing control circuit.

Figure 14:
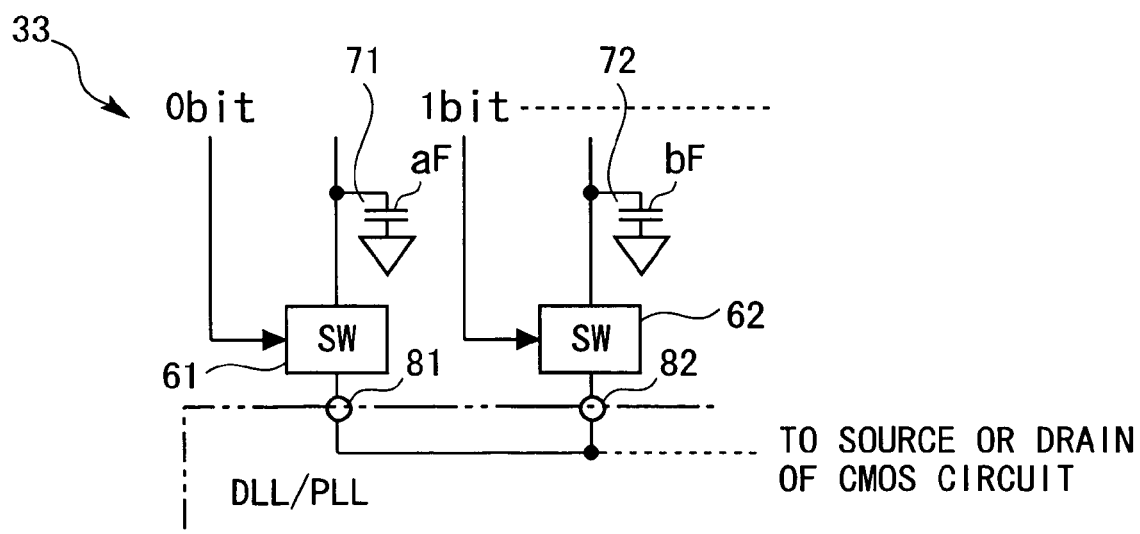
FIG. 14 is a diagram showing a circuit configuration in which the capacitor elements and the switches in FIG. 12 are externally attached to the external terminals of the timing control circuit.

FIG. 14 shows a circuit configuration, wherein the capacitor elements 71, 72 and the switches 61, 62 in FIG. 12 are externally attached to the external terminals 81, 82 of the timing control circuit (the DLL circuit 4 and the PLL circuit 2). This circuit configuration is the same as the configuration in FIG. 12, except that the capacitor elements 71, 72 and the switches 61, 62 are externally attached. Hence, the phase adjusting function is the same as in the case of FOG. 12.

This configuration being taken, the user can be provided with the function of generating the desired phase difference by use of a desired capacitor element. It is noted that a configuration as a substitute for the configuration in FIG. 14 may be such that the capacitor elements 71, 72 are externally attached to the external terminals 81, 82, while the switches 61, 62 are built in the timing control circuit.

The first embodiment adopts the configuration that the constant current circuit 10 delaying the input signal DQS is provided anterior to the delay line 4A, and the second embodiment adopts the configuration that the constant current circuit 10 shunts the control current Ccntl of the delay elements 8. By the way, these configurations in the first embodiment and the second embodiment may be combined.

Figure 15:
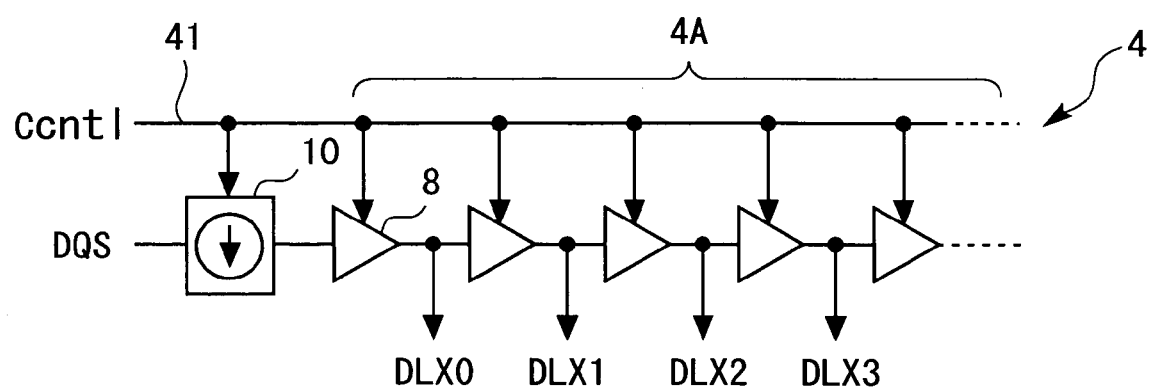
FIG. 15 is a diagram showing an example of a circuit in which the timing control circuits in the first embodiment and the second embodiment are combined.

FIG. 15 is an example of a configuration of the timing control circuit, wherein the constant current circuit 10 delaying the input signal DQS is provided anterior to the delay line 4A, and the constant current circuit 10 shunts the current given by 4×Ia as part of the control current Ccntl of the delay elements 8.

With this configuration, the control current Ccntl flowing to the delay elements 8 can be rendered substantially coincident with the control current supplied to the delay elements of the PLL circuit 2, and a signal for one wavelength of the signal generated by looping twice round the PLL circuit 2 is propagated over the DLL circuit 4 constructed of the constant current circuit 10 and the delay line 4A. As a result, the phase can be adjusted including even the delay time of the inverter circuit 9, which is originally extremely short period of delay time as compared with the delay element 8. Accordingly, even when the delay time of the inverter circuit 9 can not be ignored as compared with the delay time of the delay element 8, the signals of the more accurate phases can be acquired from the taps DLX0-DLX15.

<<Others>>

The disclosures of Japanese patent application No. JP2005-203054 filed on Jul. 12, 2005 including the specification, drawings and abstract are incorporated herein by reference.

What is claimed is:

1. A circuit comprising:

a PLL circuit generating an oscillating signal; and a delay circuit receiving the oscillating signal and generating a delayed signal from the inputted oscillating signal;

the PLL circuit including a frequency variable oscillator including a first delay element of which delay time as a concomitant of signal propagation is controlled by the delay time control signal and a phase inverting element inverting a phase of the oscillating signal, the delay circuit including:

a series of second delay elements delaying the oscillating signal supplied with the delay time control signal from the frequency variable oscillator;

an adjusting element, connected in series to the series of the second delay elements, to which the oscillating signal is propagated; and a current source supplying a drive current of the adjusting element;

wherein the delay time as the concomitant of the signal propagation in the adjusting element is controlled by an adjusting signal different from the delay time control signal, the adjusting signal sets a value of the drive current supplied from the current source to a current value determined from the current value for driving the phase inverting element and from a ratio of the number of the second delay elements included in the delay circuit to the number of the first delay elements included in the frequency variable oscillator.

2. The circuit according to claim 1, wherein the delay time control signal is a signal that synchronizes a phase of an output signal of the frequency variable oscillator with a predetermined phase of a reference signal, and the second delay element propagates the signal in delay time substantially equal to the delay time of the first delay element when the phase of the output signal is synchronized with the phase of the reference signal.

3. The circuit according to claim 1, wherein each of the series of the second delay elements outputs a frequency dividing signal after the delay time caused by each of the second delay elements when propagating the frequency dividing signal after frequency-dividing the output signals of the frequency variable oscillator by the number (n) matching with to a ratio of the number of the first delay elements corresponding to phase differences of one cycle in the frequency variable oscillator to the number of the second delay elements included in the delay circuit, and the adjusting signal controls a phase of the frequency dividing signal.

4. The circuit according to claim 1, wherein the current source includes a plurality of current supply control elements building up a current mirror circuit and a switch supplying in a cutoff enabled manner the adjusting element with output current of the current supply control element.

5. The circuit according to claim 1, wherein the current source includes a constant voltage source, a plurality of resistor elements connected in parallel with each other to the constant voltage source, and a switch supplying in a cutoff enabled manner the adjusting element with current from the constant voltage source via the plurality of resistor elements.

6. The circuit according to claim 1, wherein the adjusting element includes a plurality of capacitor elements provided between the current source and a ground potential and each becoming a load of the current source, and a switch connecting in the cutoff enabled manner each of the plurality of capacitor elements as the load of the current source.

7. The circuit according to claim 4, wherein the current source further includes a digital signal input unit controlling the cutoff and the connection of the switch.

8. The circuit according to claim 1, wherein the current source includes a constant voltage source, and a terminal train connectable to a plurality of resistor elements to be provided in parallel between the constant voltage source and the adjusting element.

9. The circuit according to claim 8, wherein the current source further includes a switch supplying in the cutoff-enabled manner the adjusting element with the current from the constant voltage source via the resistor elements.

10. The circuit according to claim 1, wherein the adjusting element includes a terminal train connectable to a plurality of capacitor elements, to be provided between the current source and the ground potential, each becoming a load of the current source.

11. The delay circuit according to claim 10, wherein the adjusting element further includes a switch connecting in the cutoff enabled manner, each of the plurality of capacitor elements connected to the terminal train as the load of the current source.

12. A circuit comprising:

a PLL circuit generating a oscillating signal; and a delay circuit receiving the oscillating signal and generating a delayed signal from the inputted oscillating signal;

the PLL circuit including a frequency variable oscillator including a first delay element of which delay time as a concomitant of signal propagation is controlled by the delay time control signal and a phase inverting element inverting a phase of the signal, the delay circuit including:

a series of second delay elements delaying the oscillating signal supplied with the delay time control signal from the frequency variable oscillator;

an adjusting element adjusting delay time of the oscillating signal in the second delay element by shunting a signal from the delay time control signal supplied to the second delay element; and wherein signal quantity shunted by the adjusting element is controlled by an adjusting signal different from the delay time control signal, the adjusting signal sets a value of the drive current supplied from the current source to a current value determined from the current value for driving the phase inverting element and from a ratio of the number of the second delay elements included in the delay circuit to the number of the first delay elements included in the frequency variable oscillator.

* * * * *